US012762307B2

(12) United States Patent
Sawal et al.

(10) Patent No.: US 12,762,307 B2
(45) Date of Patent: Oct. 13, 2026

(54) METHOD AND SYSTEM TO DETERMINE OPTIMAL RACK SPACE UTILIZATION

(71) Applicant: Dell Products L.P., Round Rock, TX (US)

(72) Inventors: Vinay Sawal, Fremont, CA (US); Udhaya Chandran Shanmugam, Santa Clara, CA (US); Ramya Ramachandran, Hopkinton, MA (US); Mahendaran Pagalpatti Vijayakumar, Chennai (IN); Ashok Kumar Janardhana, Chennai (IN)

(73) Assignee: Dell Products L.P., Round Rock, TX (US)

( * ) Notice: Subject to any disclaimer, the term of this patent is extended or adjusted under 35 U.S.C. 154(b) by 975 days.

(21) Appl. No.: 17/973,945

(22) Filed: Oct. 26, 2022

(65) Prior Publication Data

US 2024/0143873 A1 May 2, 2024

(51) Int. Cl.
*G06F 30/27* (2020.01)

(52) U.S. Cl.
CPC .................................... *G06F 30/27* (2020.01)

(58) Field of Classification Search
CPC ....................................................... G06F 30/27
USPC .............................................................. 703/6
See application file for complete search history.

(56) References Cited

U.S. PATENT DOCUMENTS

| | | | | |
|---|---|---|---|---|
| 7,644,051 | B1 * | 1/2010 | Moore | G05B 13/048 706/903 |
| 9,826,030 | B1 * | 11/2017 | Dhoolam | H04L 67/1008 |
| 9,864,417 | B2 | 1/2018 | Bermudez-Rodriguez et al. | |
| 2014/0253093 | A1 * | 9/2014 | Bermudez Rodriguez | G06F 1/3206 713/100 |
| 2015/0019195 | A1 * | 1/2015 | Davis | G06F 11/3442 703/17 |
| 2022/0180100 | A1 * | 6/2022 | Lee | G06T 17/00 |
| 2024/0129380 | A1 * | 4/2024 | Ganju | G06F 11/3062 |

* cited by examiner

*Primary Examiner* — Andre Pierre Louis
(74) *Attorney, Agent, or Firm* — Terrile, Cannatti & Chambers, LLP; Emmanuel A. Rivera

(57) ABSTRACT

Described herein are methods and a system for to optimize utilization of rack space supporting components of an existing client site rack. Real time data as to the rack space is collected, along with an objective function as to expansion. Information as to an initial design configuration is retrieved. A reinforcement learning algorithm processes real time data, the objective function, and initial design configuration to determine a deployment recommendation.

17 Claims, 4 Drawing Sheets

METHOD AND SYSTEM TO DETERMINE OPTIMAL RACK SPACE UTILIZATION

BACKGROUND OF THE INVENTION

Field of the Invention

The present invention relates to optimizing rack space of devices or components that support a cloud service. More specifically, embodiments of the invention provide for determining capability of current rack space to support or additional racks for expansion of devices or components at a customer site.

Description of the Related Art

Entities, such as companies, are increasing using cloud computing to provide services that are flexible, accessible, expandable, and reliable. Cloud computing can be through public cloud, private cloud, or a hybrid combination. In certain cases, an entity, such as a customer of cloud service provider, can also have devices or components that are physically located at a site of the customer, such as in a data center. Such devices or components can be installed in one or more computing racks.

The devices or components can be segmented into particular types or categories, such as computing, switching, storage, management, etc. Multiple devices and components interact with one another and provide services. Providing on site rack space (i.e., racks) requires planning, allocation of physical space, power, cooling, heat, etc.

When a customer of a cloud service provider, desires to expand, replace, or upgrade devices or components in a rack of the site of the customer, a determination necessary if the existing rack or racks, can support expansion or changes of devices or components. Providing a new rack can be simple solution; however, a new rack requires additional planning, physical space allocation, providing power, providing cooling/heating, etc. Furthermore, an additional rack may be unnecessary. The solution may be optimal utilization of an existing on site rack or racks.

SUMMARY OF THE INVENTION

A computer-implementable method, system and computer-readable storage medium for optimization of utilization of rack space supporting components comprising collecting real time data as to the rack space of an existing rack and components; receiving an objection function as to desired functionality expansion of components for the existing rack; retrieving initial design configuration information of the existing rack; processing the real time data, objection function, and initial design configuration information using a reinforcement learning algorithm to produce a deployment recommendation; and providing the deployment recommendation to a customer information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Implementations described herein support cloud computing service of multiple devices and components (hereafter, component). Embodiments provide for a rack space optimization engine that includes a reinforcement learning algorithm. Real time status of available rack space at a customer site is received. Capability and accommodations of the rack(s) of the customer site is considered. An objective function is received as to desired expansion function and component(s) that support the function. Information as to future expansion provisions of the rack(s) customer site is considered. The reinforcement learning algorithm considers the information and provides a recommendation.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, gaming, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a microphone, keyboard, a video display, a mouse, etc. The information handling system may also include one or more buses operable to transmit communications between the various hardware components.

Figure 1:
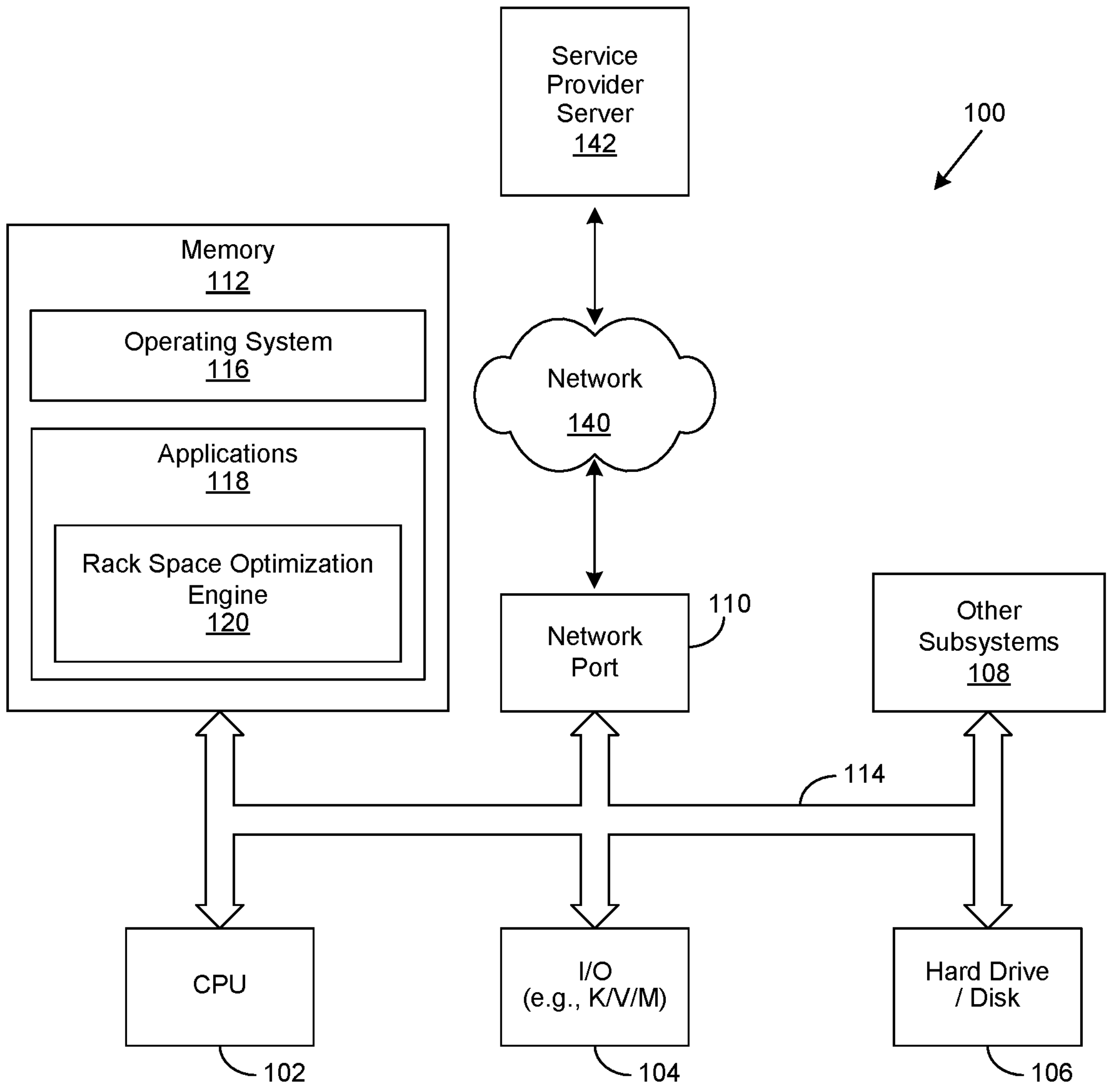
FIG. 1 is a general illustration of components of an information handling system as implemented in the present invention.

FIG. 1 is a generalized illustration of an information handling system (IHS) 100 that can be used to implement the system and method of the present invention. The information handling system (IHS) 100 includes a processor (e.g., central processor unit or "CPU") 102, input/output (I/O) devices 104, such as a microphone, a keyboard, a video display or display device, a mouse, and associated controllers (e.g., K/V/M), a hard drive or disk storage 106, and various other subsystems 108.

In various embodiments, the information handling system (IHS) 100 also includes network port 110 operable to connect to a network 140, where network 140 can include one or more wired and wireless networks, including the Internet. Network 140 is likewise accessible by a service provider server 142.

The information handling system (IHS) 100 likewise includes system memory 112, which is interconnected to the foregoing via one or more buses 114. System memory 112 can be implemented as hardware, firmware, software, or a combination of such. System memory 112 further includes an operating system (OS) 116 and applications 118.

Implementations provide for applications 118 to include a rack space optimization engine 120. The rack space optimization engine 120 includes reinforcement learning algorithm further described herein, to provide deployment recommendation as to device or component expansion in a customer site rack. In general, rack space optimization engine 120 collects real time data from the customer site rack, a goal or objective (objective function) as to component expansion, and expansion configuration provisions that were determined for the customer site rack. As further described herein, the reinforcement learning algorithm processes the data and information and provides the deployment recommendation.

Figure 2:
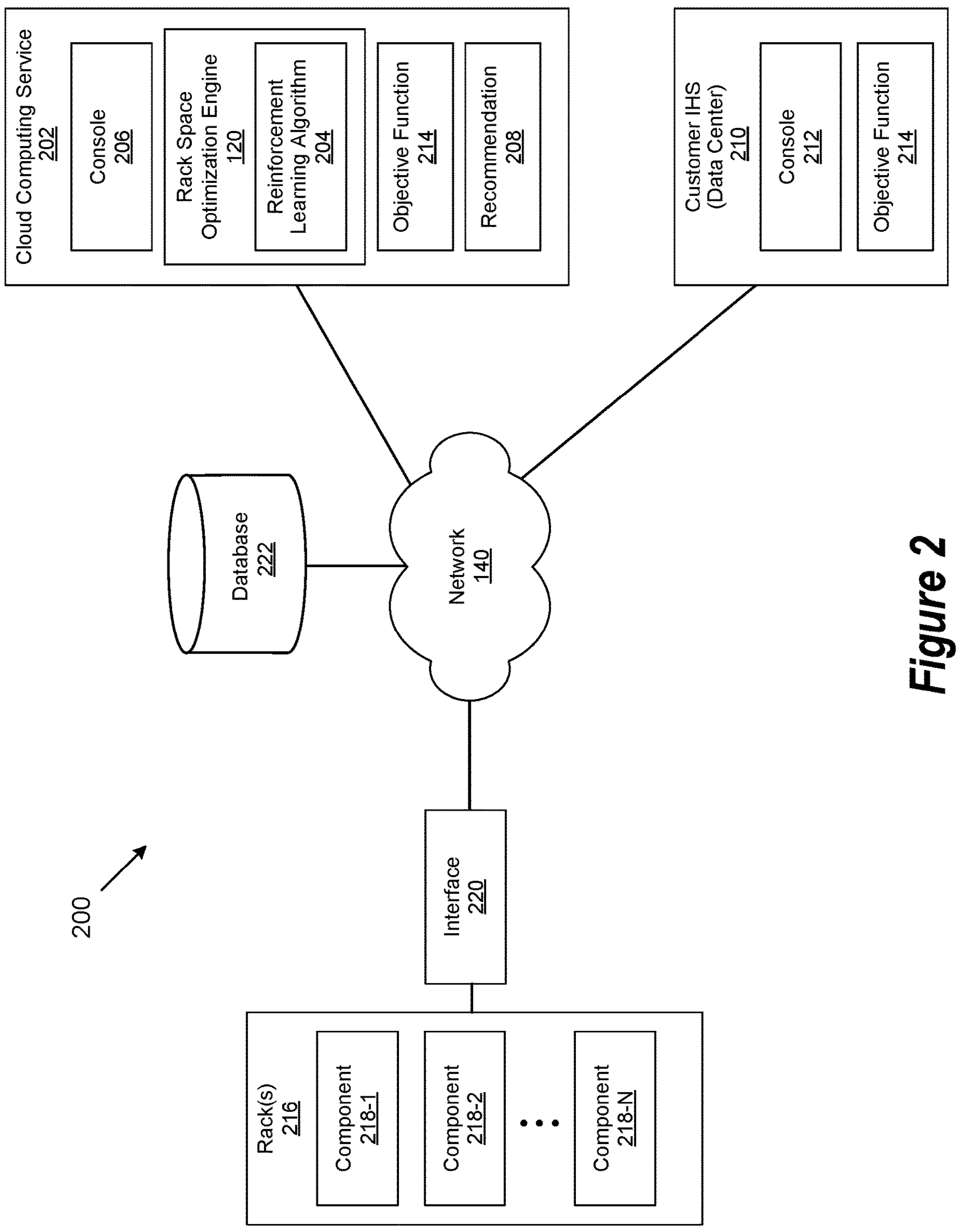
FIG. 2 is a system as implemented in the present invention.

FIG. 2 shows a system 200 that supports the processes described herein. Various implementations provide for the system 200 to include a cloud computing service 202. Embodiments provide for the cloud computing service 202 to include or use various computing resources, such as information handling system (IHS) 100.

Cloud computing service 202 includes the rack space optimization engine 120 as described in FIG. 1. Rack space optimization engine 120 includes reinforcement learning algorithm 204 to perform processes described herein. Implementations further provide for cloud computing service 202 to include a console 206 that shows deployment recommendation as to components as to existing customer site rack(s) or need for new rack(s). A recommendation feature 208 can also be included in cloud computing service 202.

The system 200 can include a customer information handling system 210. Implementations provide for the customer IHS 210 to include a console 212 to interact with the other computing devices, sites, and services. In particular, console 212 can be configured to interact with cloud computing service 202. An objective function 214 is provided at the customer IHS 210, which can be entered or received at the console 212. The objective function 214 is a goal or objective by a customer as to expansion of components. A customer desires to expand functionality at their customer site rack. There can be various functionalities, including computing, memory, networking, management, etc. One or more components would be required to meet the desired objective or objective function 214. For example, the objective of customer may be to expand memory functionality from 1.0 TB to 1.5 TB. There would be a need to add one or more new components to the customer site rack to support the objective. The objective function 214 is sent to the cloud computing service 202, and is used by the rack space optimization engine 120 as further described herein.

Cloud computing service 202 and customer information handling system 210 are connected to network 140. As described above, network 140 can include one or more wired and wireless networks, including the Internet. Network 140 connects cloud computing service 202 and customer information handling system 204 to other elements described of system 200.

System 200 includes one or more equipment racks 216 that support cloud computing service 202. Implementations provide for the equipment rack(s) 216 to be operated or controlled by a customer of support cloud computing service 202. For example, the equipment rack(s) 216 are part of a data center of the customer, or considered as customer site based.

The equipment rack(s) 216 include multiple devices or components 214. Components 214 can be grouped into various categories, such as computing (including virtual), switching, storage, management, etc.

In various implementations, interface(s) 220 connect the equipment rack(s) 216 to the network 140. For example, interface(s) 220 can include a web user interface, ops ramp interface, virtual component interface such as ESXi, server management component interface such as vCenter, etc. Real time data is provided from equipment rack(s) 216 to the cloud computing service 202. Such real time data can include rack status, which rack units/spaces are currently occupied, which rack units/spaces have to be left unoccupied based on infrastructure constraints, including networking, cabling, cooling, heating, power, etc.

The system 200 to include a database 222. Implementations provide for other data to be considered and processed by the rack space optimization engine 120. Such data can be stored in and accessed from the database 222. The data can include an initial design of rack(s) 216 which can consider future expansion, such as contiguous rack space for future components.

Figure 3:
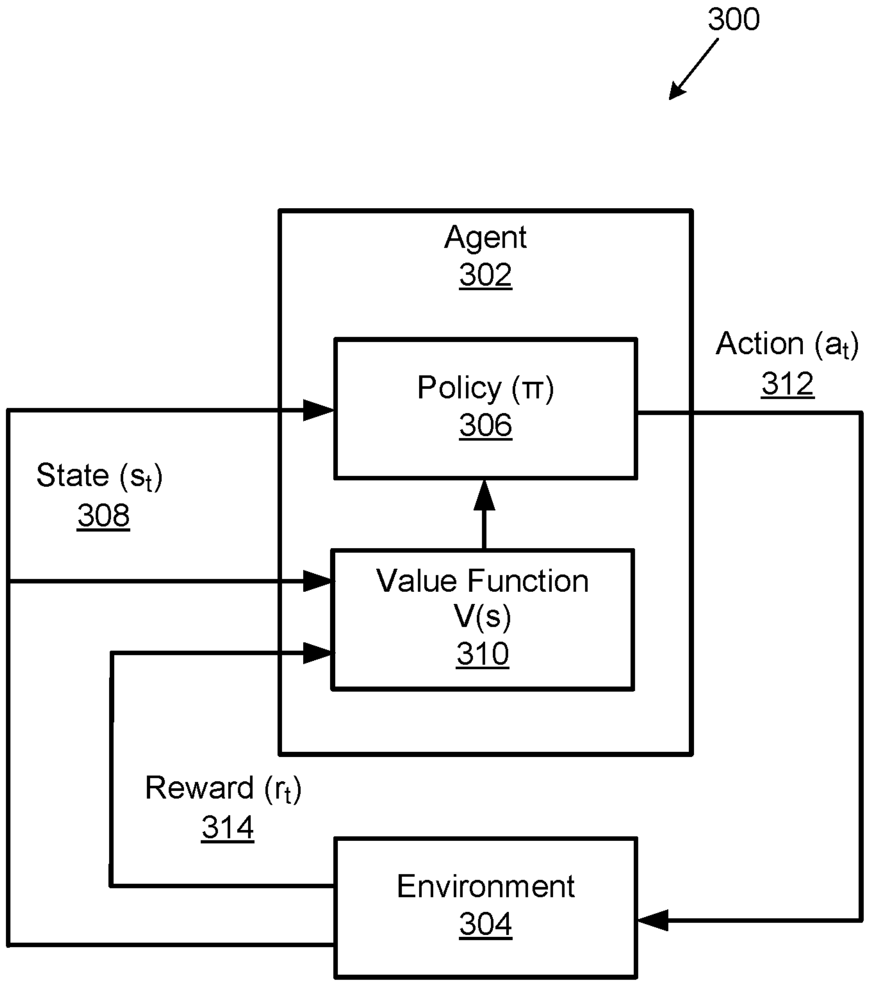
FIG. 3 is a reinforcement learning algorithm.

FIG. 3 is a block diagram of reinforcement learning algorithm 300, such as reinforcement learning algorithm 204. The reinforcement learning algorithm 300 is considered a supervised learning process, and in various implementations, a Markov decision process (MDP).

An agent 302 interacts with an environment 304 based on a policy (π) 306. The agent 302 receives time based state ($s_t$) data 308, received by the policy (π) 306 and a value function V(s) 310. The value function V(s) 310 provides data updating the policy (π) 306. Based on the policy (π) 306, the agent 302 takes an action ($a_t$) 312. If the agent 302 takes a right action ($a_t$) 312, a reward ($r_t$) 314 is provided from the environment 304 to the value function V(s) 310.

As the agent 302 performs the right actions ($a_t$) 312, $a_t$ each step of the way, it gets more and more rewards resulting in an optimal solution. The value function V(s) 310 records rewards ($r_t$) 314 accumulated to a certain time. The concept being positive reinforcement. The agent 302 takes a sequence of actions ($a_t$) 312 based on the defined policy (π) 306 to maximize the reward ($r_t$) 314.

Environment 304 can be considered as the customer site rack(s) 216. Policy (π) 306 can be based on objective function 214, initial design data/information, infrastructure constraints (e.g., networking, cabling, cooling, heating, power, etc.). Action ($a_t$) 312 can be considered as deployment recommendation. Reward ($r_t$) 314 and based state ($s_t$) data 308 are updated as to component expansion in rack space of customer site rack(s) 216, until an optimal solution or deployment recommendation is produced.

The optimal solution is a deployment recommendation that includes whether the existing client site rack(s) 216 can be used for expansion or additional rack(s) are needed. The deployment recommendation can also include particular rack space units in existing client site rack(s) 216. Implementations provide for the deployment recommendation to be sent from recommendation feature 208 to customer information handling system 210.

Figure 4:
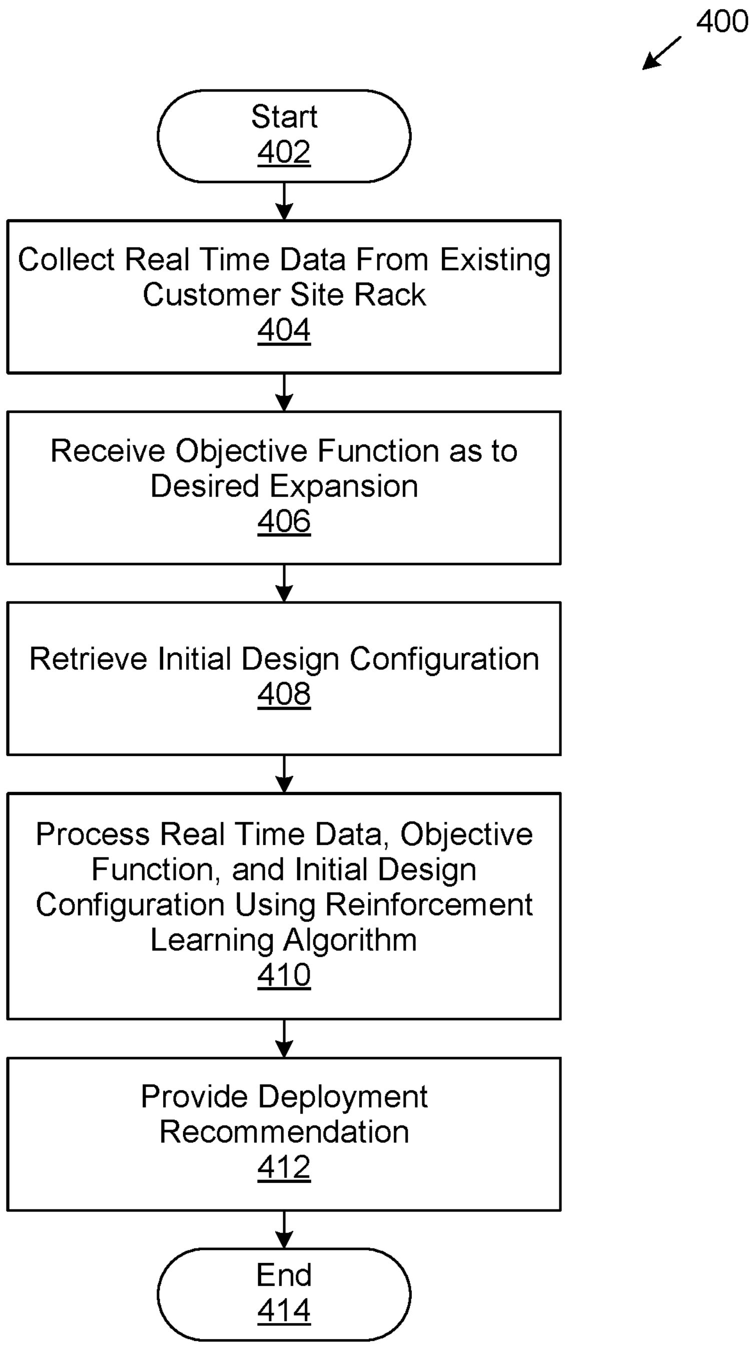
FIG. 4 is a generalized flowchart for optimization of utilization of rack space supporting components.

FIG. 4 shows a generalized flowchart for optimization of utilization of rack space supporting components. Implementations provide for the steps of process 400 to be performed by the cloud computing service 202. The order in which the method is described is not intended to be construed as a limitation, and any number of the described method steps may be combined in any order to implement the method, or alternate method. Additionally, individual steps may be deleted from the method without departing from the spirit and scope of the subject matter described herein. Furthermore, the method may be implemented in any suitable hardware, software, firmware, or a combination thereof, without departing from the scope of the invention.

At step 402, the process 400 starts. At step 404, real time data is collected from equipment rack(s) 216. Such real time data can include rack status, which rack units/spaces are currently occupied, which rack units/spaces have to be left occupied based on infrastructure constraints, including networking, cabling, cooling, heating, power, etc.

At step 406, an objective function 214 is received of a customer as to expansion of components in rack(s) 216. The objective function 214 is relates to functionality expansion. There can be various functionalities, including computing, memory, networking, management, etc. One or more components would be required to meet the desired objective or objective function 214.

At step 408, initial design configuration information of rack(s) 216 is retrieved. The design configuration information considers future expansion, such as contiguous rack space for future components is retrieved. Implementations provide for retrieving such data from database 222.

At step 410, the real time data, objective function, and initial design configuration information, are processed by the reinforcement learning algorithm 204 to provide a deployment recommendation. Implementations provide for the reinforcement learning algorithm 204 to be configured as a supervised learning process, such as a Markov decision process (MDP) described in shown in FIG. 3 and described in the accompanying description.

At step 414, the deployment recommendation is provided to the customer information handling system 210. The recommendation feature 208 can communicate the deployment feature. At step 416, the process 400 ends.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

As will be appreciated by one skilled in the art, the present invention may be embodied as a method, system, or computer program product. Accordingly, embodiments of the invention may be implemented entirely in hardware, entirely in software (including firmware, resident software, micro-code, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random-access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object-oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described with reference to flowchart illustrations and/or step diagrams of methods, apparatus (systems) and computer program products according to embodiments of the invention. It will be understood that each step of the flowchart illustrations and/or step diagrams, and combinations of steps in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram step or steps.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A computer-implementable method for optimization of utilization of rack space supporting components comprising:

collecting, via one or more monitoring interfaces coupled to equipment racks, real time operational data associated with rack space of an existing rack and components installed in the rack, the real-time operational data including rack unit occupancy and infrastructure constraints including power, cooling, and cabling;

receiving, from a customer information handling system through a network interface, an objective function specifying a desired expansion of computing expansion of computing functionality components for the existing rack;

retrieving, from a configuration database, initial design configuration information of the existing rack, including reserved rack units and expansion constraints;

processing, by a rack space optimization engine executing on one or more processors, the real time data, objection function, and initial design configuration information using a reinforcement learning algorithm implemented as a Markov decision process including an agent, policy, state data, and reward function, to determine an optimized rack deployment configuration for installation of one or more additional components within the rack; and automatically generating and transmitting a deployment recommendation identifying one or more rack unit locations within the existing rack for installation of the additional components to the customer information handling system.

2. The computer-implementable method of claim 1, wherein the real time data includes rack status, rack space occupancy, and infrastructure constraints.

3. The computer-implementable method of claim 1, wherein the objective function is provided by the customer information handling system.

4. The computer-implementable method of claim 1, wherein the initial design configuration considers future expansion, including contiguous rack space for future components.

5. The computer-implementable method of claim 1, wherein the reinforcement learning algorithm implements a supervised learning process.

6. The computer-implementable method of claim 1, wherein the providing is through a recommendation feature.

7. A system comprising:

a plurality of processing systems communicably coupled through a network, wherein the processing systems include non-transitory, computer-readable storage medium embodying computer program code interacting with a plurality of computer operations optimization of utilization of rack space supporting components comprising:

collecting, via one or more monitoring interfaces coupled to equipment racks, real time operational data associated with rack space of an existing rack and components installed in the rack, the real-time operational data including rack unit occupancy and infrastructure constraints including power, cooling, and cabling;

receiving, from a customer information handling system through a network interface, an objective function specifying a desired expansion of computing expansion of computing functionality components for the existing rack;

retrieving, from a configuration database, initial design configuration information of the existing rack, including reserved rack units and expansion constraints;

processing, by a rack space optimization engine executing on one or more processors, the real time data, objection function, and initial design configuration information using a reinforcement learning algorithm implemented as a Markov decision process including an agent, policy, state data, and reward function, to determine an optimized rack deployment configuration for installation of one or more additional components within the rack; and automatically generating and transmitting a deployment recommendation identifying one or more rack unit locations within the existing rack for installation of the additional components to the customer information handling system.

8. The system of claim 7, the real time data includes rack status, rack space occupancy, and infrastructure constraints.

9. The system of claim 7, wherein the objective function is provided by the customer information handling system.

10. The system of claim 7, wherein the initial design configuration considers future expansion, including contiguous rack space for future components.

11. The system of claim 7, wherein the reinforcement learning algorithm implements a supervised learning process.

12. The system of claim 7, wherein the providing is through a recommendation feature.

13. A non-transitory, computer-readable storage medium embodying computer program code for optimization of utilization of rack space supporting components, the computer program code comprising computer executable instructions configured for:

collecting, via one or more monitoring interfaces coupled to equipment racks, real time operational data associated with rack space of an existing rack and components installed in the rack, the real-time operational data including rack unit occupancy and infrastructure constraints including power, cooling, and cabling;

receiving, from a customer information handling system through a network interface, an objective function specifying a desired expansion of computing expansion of computing functionality components for the existing rack;

retrieving, from a configuration database, initial design configuration information of the existing rack, including reserved rack units and expansion constraints;

processing, by a rack space optimization engine executing on one or more processors, the real time data, objection function, and initial design configuration information using a reinforcement learning algorithm implemented as a Markov decision process including an agent, policy, state data, and reward function, to determine an optimized rack deployment configuration for installation of one or more additional components within the rack;

and automatically generating and transmitting a deployment recommendation identifying one or more rack unit locations within the existing rack for installation of the additional components to the customer information handling system.

14. The non-transitory, computer-readable storage medium of claim 13, wherein the real time data includes rack status, rack space occupancy, and infrastructure constraints.

15. The non-transitory, computer-readable storage medium of claim 13, wherein the objective function is provided by the customer information handling system.

16. The non-transitory, computer-readable storage medium of claim 13, wherein the initial design configuration considers future expansion, including contiguous rack space for future components.

17. The non-transitory, computer-readable storage medium of claim 13, wherein the reinforcement learning algorithm implements a supervised learning process.

* * * * *